United States Patent [19]

Sato

[11] Patent Number: 4,476,439
[45] Date of Patent: Oct. 9, 1984

[54] LEVEL SHIFTING CIRCUIT

[75] Inventor: Reisuke Sato, Saitama, Japan

[73] Assignee: Pioneer Electronic Corporation, Tokyo, Japan

[21] Appl. No.: 266,785

[22] Filed: May 26, 1981

[30] Foreign Application Priority Data

May 26, 1980 [JP] Japan .................................. 55-69794

[51] Int. Cl.³ .......................... H03F 3/45; H03G 3/18
[52] U.S. Cl. ..................................... 330/254; 330/110;
330/256; 330/257; 330/284; 330/288; 330/289;
455/188
[58] Field of Search ............... 330/110, 144, 145, 254,
330/256, 257, 284, 288, 289, 305; 455/188–190,
195; 334/15; 358/191.1, 192.1, 193.1

[56] References Cited

U.S. PATENT DOCUMENTS 4,015,149 3/1977 Tsunekawa et al. ........... 330/289 X
4,055,812 10/1977 Rosenthal ....................... 330/257 X

*Primary Examiner*—James B. Mullins
*Attorney, Agent, or Firm*—Sughrue, Mion, Zinn, Macpeak & Seas

[57] ABSTRACT

A level shifting circuit capable of operating with a wide range of impedances of a signal source without backflow of current and without a buffer circuit. A feedback element is coupled between an inverting input and an output of an operational amplifier. An output of a current source is connected to the inverting input of the operational amplifier while the signal to be level shifted is applied to the non-inverting input thereof. The current source may be a current mirror circuit and a temperature compensating diode may be coupled in series with the feedback element.

9 Claims, 10 Drawing Figures

4,476,439

LEVEL SHIFTING CIRCUIT

BACKGROUND OF THE INVENTION

The present invention relates to a level shifting circuit, and more particularly to a level shifting circuit using an operational amplifier.

A prior art level shifting circuit using an operational amplifier is shown in FIG. 1 in which an input voltage $V_i$ to be level shifted is applied through a resistor $R_1$ to a non-inverting input of the operational amplifier 1 while applying thereto a level shifting voltage E through a resistor $R_2$. Negative feedback using an output voltage $V_0$ of the operational amplifier 1 is provided through a negative feedback circuit including resistors $R_3$ and $R_4$.

Provided that the operational amplifier 1 is substantially ideal, that is if its gain and its input impedance are essentially infinite, and the resistances of the resistors $R_1$ through $R_4$ are all equal to R, then the non-inverting and inverting input voltages V+ and V− can be respectively expressed as follows:

$$V+ = (E+V_i)/2, \text{ and}$$

$$V- = V_0/2. \qquad (1)$$

Since +V is approximately equal to V−, the following equation can be obtained from the above equations (1).

$$V_0 = V_i + E. \qquad (2)$$

As is apparent from the above, the output voltage $V_0$ of the operational amplifier 1 is level shifted by the voltage E with respect to the input voltage $V_i$.

In order to satisfy the above equation (2), it is necessary that the impedance of a signal source be zero or extremely small in comparison with the resistance value R of the resistors.

Due to the specific relation between the input voltage $V_i$ and the level shifting voltage E, a current may flow back to the input side of the operational amplifier 1 from the level shifting power source E. Such a condition should be avoided, depending upon the nature of the signal source. Accordingly, in the case where the back-flow of the current must be prevented or the impedance of the signal source is not negligible, it is necessary to provide a buffer circuit.

Moreover, there is a requirement that the level shifting voltage E be varied in the circuit shown in FIG. 1. In order to comply with such a requirement, however, a disadvantage is introduced in that the construction of the level shifting voltage source becomes complicated.

SUMMARY OF THE INVENTION

Accordingly, an object of the invention is to provide a level shifting circuit eliminating the aforementioned disadvantages.

In accordance with the invention, a feedback element is provided between an inverting input of an operational amplifier and an output thereof, an output of a current source is connected to the inverting input of the operational amplifier, and an input voltage to be level shifted is applied to the non-inverting input of the operational amplifier.

DESCRIPTION OF THE PREFERRED EMBODIMENTS

The invention will be described with reference to the drawings.

Figure 1:
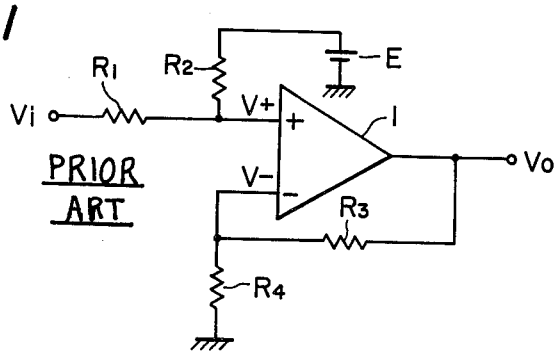
FIG. 1 is a circuit diagram showing a prior art level shifting circuit.
Figure 2:
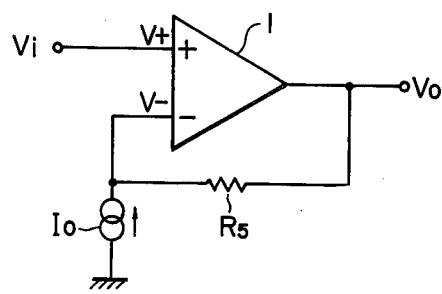
FIGS. 2–5 are circuit diagrams showing various embodiments of a level shifting circuit according to the invention.

FIG. 2 is a circuit diagram showing a preferred embodiment of a level shifting circuit of the invention. An input voltage $V_i$ to be level shifted is applied to a non-inverting input V+ of an ideal operational amplifier 1. A negative feedback resistor element $R_5$ is connected between an inverting input V− of the operational amplifier 1 and the output $V_0$ thereof. An output of a current source $I_0$ is connected to the inverting input V− of the operational amplifier.

Because the current of the current source $I_0$ flows through feedback resistor element $R_5$, the following equation is established:

$$V_0 = V- + I_0 R_5. \qquad (3)$$

Because $V+ = V_i$, $V+ = V-$, the following equation can be obtained from equation (3).

$$V_0 = V_i + I_0 R_5. \qquad (4)$$

As can be appreciated from equation (4), the input voltage $V_i$ is level shifted by a voltage expressed by the product of the current $I_0$ and the resistance of the resistor $R_5$. If the direction of the level shifting is desired to be reversed, the connection of the current source $I_0$ is reversed. By varying the resistance value $R_5$ or the current $I_0$ of the current source, the amount of the level shifting can be adjusted easily and freely.

Figure 3:
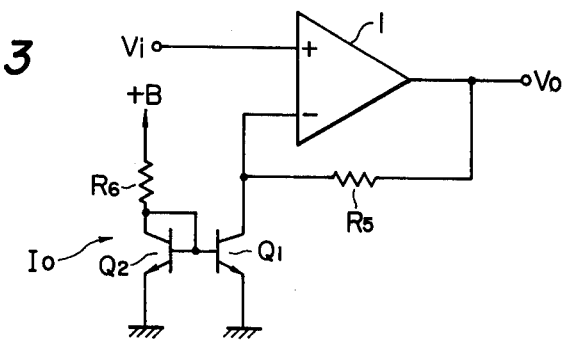

FIG. 3 is a circuit diagram showing a specific example of the current source $I_0$ shown in FIG. 2, in which a current mirror circuit of a common-base configuration is employed. The current output is varied by adjusting the resistance value of the resistor $R_6$ so that the level shifting voltage is varied.

Figure 4:
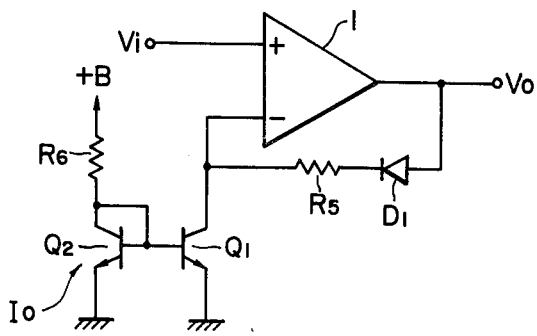

Referring to FIG. 4, a diode $D_1$ is interposed in the feedback path of the circuit shown in FIG. 3 in order to provide temperature compensation for the transistors $Q_1$ and $Q_2$ forming the current mirror circuit.

Figure 5:
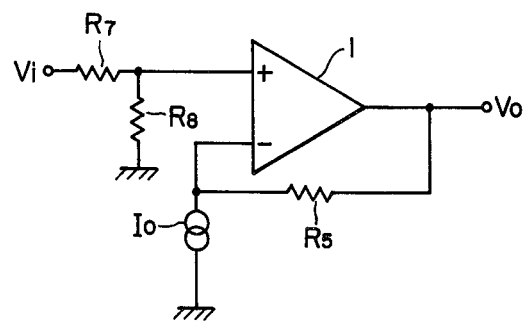

FIG. 5 is a circuit diagram showing another embodiment of the invention where like numerals or like symbols used in FIG. 2 are used to indicate like parts or components. In FIG. 5, the input voltage $V_i$ is applied to the input of the operational amplifier through an input attenuating circuit composed of resistors $R_7$ and $R_8$. The input attenuating circuit acts to lower the gain with respect to the input voltage.

According to the invention, as the signal source is isolated from the current source circuit which provides the level shifting operation, the impedance of the signal source is unaffected. Further, the problem that the current flows backward to the signal source does not occur. Moreover, the invention is advantageous in that the amount of level shifting can be freely set to either a plus or minus level.

Application of the invention to an electronic tuning receiver will next be described with reference to accompanying FIGS. 6-10.

Figure 6:
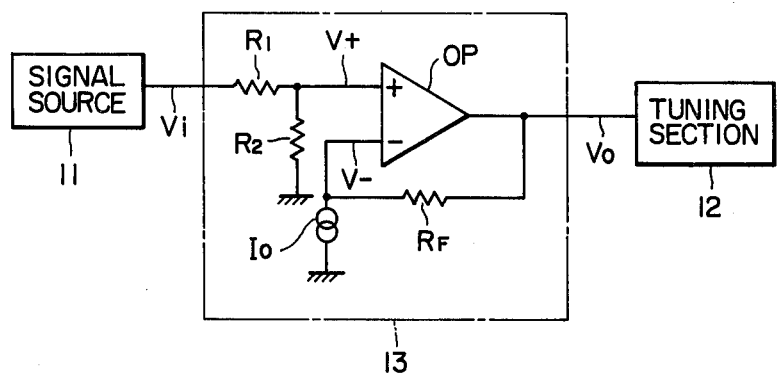
FIGS. 6–9 are circuit diagrams showing various applications of the invention.

In the circuit diagram of FIG. 6, reference numerals 11 and 12 denote respectively a voltage signal source and tuning section, 13 indicates a circuit of the invention inserted between a voltage signal source 11 and a tuning section 12. A voltage $V_i$ generated at an output of the signal source 11 is supplied to the non-inverting input of an ideal operational amplifier OP in the circuit 13 through a resistor $R_1$. A resistor $R_2$ is connected between this non-inverting input and ground. A negative feedback resistor $R_F$ is connected between the inverting input of the operational amplifier and the output thereof. A current output of a current source $I_0$ is connected to the non-inverting input.

Figure 7:
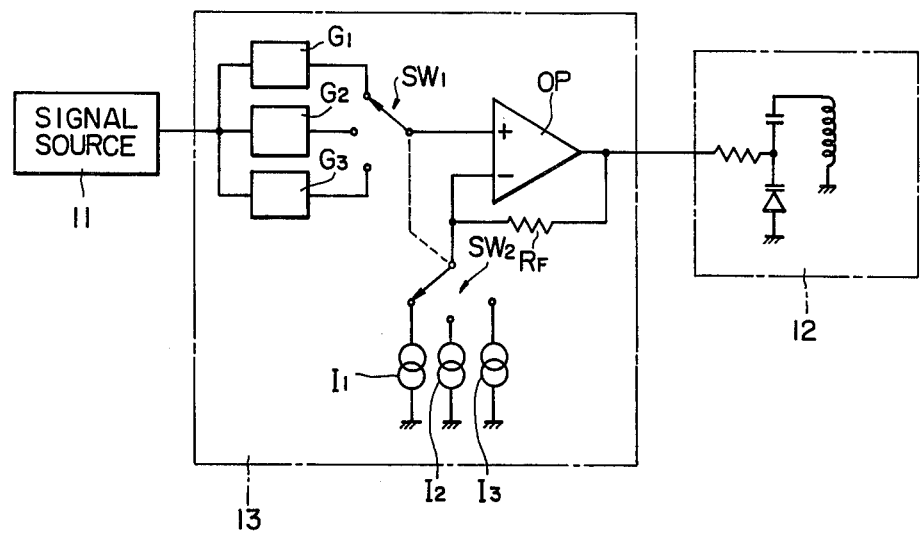

FIG. 7 shows an application of the invention to an FM electronic tuning receiver capable of receiving general FM broadcasts and the audio portion of TV channels in the same frequency band. Here, the output voltage from the signal source 11 has a range covering all of the FM broadcast band signals and adjacent TV channels.

$G_1$, $G_2$ and $G_3$ in FIG. 7 are gain setting circuits, and $I_1$, $I_2$ and $I_3$ are constant current sources. These circuits and current sources are, respectively, selected and connected to the non-inverting input and the inverting input of operational amplifier OP by mechanically interlocked change-over switches $SW_1$ and $SW_2$.

Figure 8:
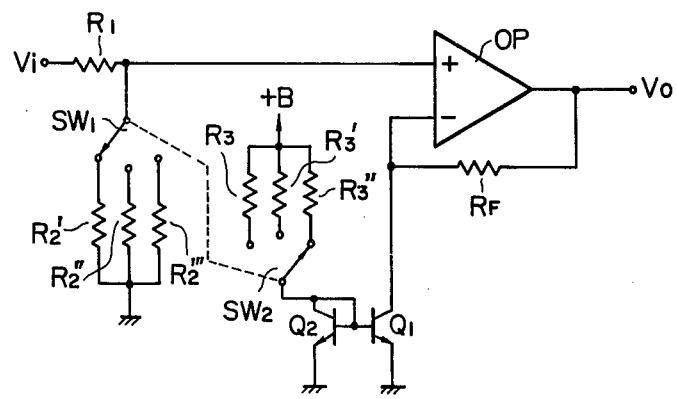

FIG. 8 is a circuit diagram of embodiments of the gain setting circuits $G_1$, $G_2$, $G_3$ and the current sources $I_1$, $I_2$, $I_3$. The gain setting circuit includes resistors $R_2'$, $R_2''$ and $R_2'''$ having values satisfying the following equations:

$$\frac{V_2 - V_1}{V_{max} - V_{min}} = \frac{R_2'}{R_1 + R_2'}$$

$$\frac{V_4 - V_3}{V_{max} - V_{min}} = \frac{R_2''}{R_1 + R_2''}$$

$$\frac{V_6 - V_5}{V_{max} - V_{min}} = \frac{R_2'''}{R_1 + R_2'''}.$$

Resistor $R_2$ in FIG. 6 is here replaced by the resistors $R_2'$, $R_2''$ and $R_2'''$ switched by switch $SW_1$. The current sources $I_1$, $I_2$ and $I_3$ make up a current mirror circuit with transistors $Q_1$ and $Q_2$ whose bases are commonly connected, and resistors $R_3$, $R_3'$, $R_3''$ that are selected and connected by a switch $SW_2$ to set the current output to one of $I_1$, $I_2$ and $I_3$.

Figure 9:
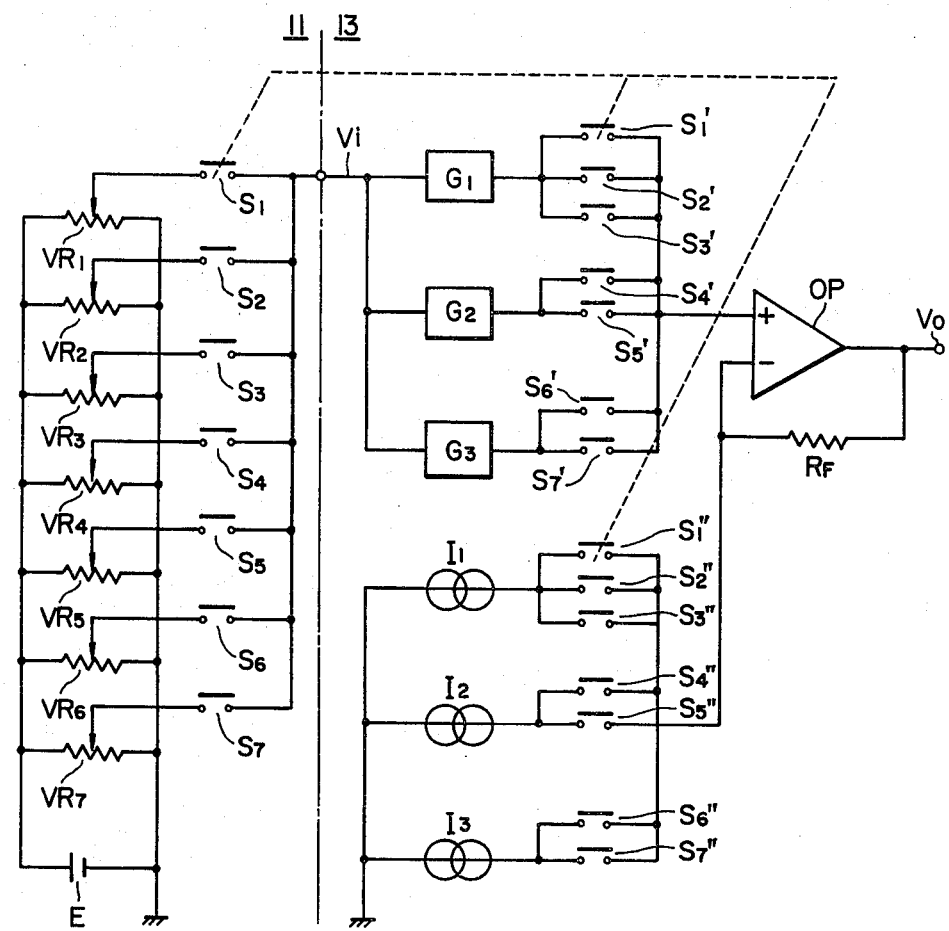
Figure 10:
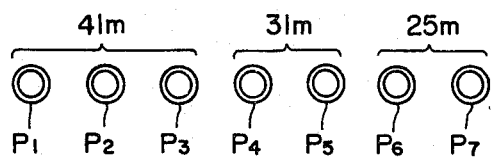
FIG. 10 is a simplified diagram showing a operative section of a receiver in FIG. 9.

FIG. 9 is a circuit diagram of a shortwave receiver having, for instance three presetting operative buttons $P_1$, $P_2$ and $P_3$ for the 41 meter band, two buttons $P_4$ and $P_5$ for the 31 meter band, and two buttons $P_6$ and $P_7$ for the 25 meter band. The buttons are arranged as shown in FIG. 10. The presetting operative buttons $P_1$ to $P_7$ each are coupled to like numbered ones of switches $S_1$ to $S_7$, $S_1'$ to $S_7'$ and $S_1''$ to $S_7''$ which are interlocked mechanically wherein each operative button is coupled to three switches. One terminal of each of switches $S_1$ to $S_7$ is connected to a corresponding wiper contact of variable resistors $VR_1$ to $VR_7$ with the second contacts of the switches $S_1$ to $S_7$ coupled together and to an output of the voltage generator 11. Switches $S_1'$ to $S_3'$, $S_4'$ to $S_5'$ and $S_6'$ to $S_7'$ are respectively connected in parallel between corresponding ones of the gain setting circuits $G_1$, $G_2$ and $G_3$ and the non-inverting input of an operational amplifier OP. Switches $S_1''$ to $S_3''$, $S_4''$ and $S_5''$, $S_6''$ and $S_7''$ are respectively connected between the current sources $I_1$, $I_2$, $I_3$ and the inverting input of the operational amplifier OP. Using this circuit, the operability of the receiver is improved as separate operations are not needed for band changing.

In the above-described embodiment, only two cases, namely the use of variable resistors as the voltage generator 11 and the use of fixed resistors coupled through switches, have been described. However, the voltage signal source is not limited to these circuits only and other arrangements may be used if desired.

In FIG. 6, if the minimum and maximum values of the DC voltage generated by the signal source 11 are represented, respectively, by $V_{min}$ and $V_{max}$ and the variable voltage of the tuning section 12 used for tuning over a predetermined frequency range is in the range of $V_{f1}$ to $V_{f2}$, the following condition must be satisfied in order to apply to the tuning section 12 the voltage from $V_{f1}$ to $V_{f2}$ when the DC voltage generated by the signal source 11 changes within the range from $V_{min}$ to $V_{max}$:

$$\frac{V_{f2} - V_{f1}}{V_{max} - V_{min}} = \frac{R_2}{R_1 + R_2}.$$

Specifically, the resistance values of the resistors $R_1$ and $R_2$ must be set so as to satisfy the above equation, and further the current $I_0$ of the constant current source may be determined to satisfy the following equation:

$$V_{f1} = I_0 R_F.$$

The non-inverting input voltage $V+$ is:

$$V+ = \frac{R_2}{R_1 + R_2} V_i.$$

When the output voltage V of the signal source 11 varies in the range from $V_{min}$ to $V_{max}$, the input voltage $V_0$ applied to the tuning section 12 varies in the range from $V_{f1}$ to $V_{f2}$ satisfying the following equation:

$$V_0 = \frac{V_{f2} - V_{f1}}{V_{max} - V_{min}} V_i + V_{f1}.$$

Thus, the frequency of the tuning section 12 is adjusted in the range from $f_1$ to $f_2$.

Therefore, even if the variable range of the DC voltage generated in the signal source 11 does not coincide with the variable range of the tuning voltage which is necessary for the tuning circuit to tune over the predetermined frequency range, the tuning in the circuit can be effected over the predetermined frequency range by using the full range of DC voltage generated in the signal source.

In accordance with this invention, it is possible to provide a receiver which is capable of reproducing FM broadcasts and sound or voice of TV signals by a single tuning circuit without lowering the tuning resolving power of the receiver. The same effect can be attained in a shortwave receiver in which plural bands are tuned with a single tuning circuit.

What is claimed is:

1. A level shifting circuit, consisting of an operational amplifier; a feedback element provided between an inverting input of said operational amplifier and an output thereof; and a constant current source, an output of said constant current source being connected only to said inverting input of said operational amplifier, a signal to be level shifted being applied only to a noninverting input of said operational amplifier.

2. The level shifting circuit of claim 1 wherein said current source comprises a current mirror circuit.

3. The level shifting circuit of claim 2 wherein said current mirror circuit comprises an NPN first transistor having a collector coupled through a resistor to a positive voltage source and to a base thereof and an emitter coupled to ground; and an NPN second transistor having a base coupled to said base of said first transistor, an emitter coupled to ground and a collector coupled to said inverting input of said operational amplifier.

4. A level shifting circuit comprising: an operational amplifier; a feedback element provided between an inverting input of said operational amplifier and an output thereof; a plurality of gain setting circuits having inputs coupled to an output of a signal source; a first switch for connecting an output of a selected one of said gain setting circuits to a non-inverting input of said operational amplifier; and a second switch mechanically interlocked with said first switch for selecting corresponding values of constant current applied to said inverting input of said operational amplifier corresponding to the selected one of said gain setting circuits.

5. A level shifting circuit comprising: an operational amplifier; a feedback element provided between an inverting input of said operational amplifier and an output thereof; first through third resistors having first terminals coupled to a positive voltage source; an NPN first transistor having an emitter coupled to ground; an NPN second transistor having a base coupled to a base of said first transistor and an emitter coupled to ground; a first switch for selectively coupling a second terminal of a selected one of said first through third resistors to a collector and said base of said first transistor, a collector of said second transistor being coupled to said inverting input of said operational amplifier, wherein operation of said first switch selects a constant current value applied to said inverting input of said operational amplifier; a fourth resistor coupled between a voltage signal source and a non-inverting input of said operational amplifier; a fifth through seventh resistors having first terminals coupled to ground; and a second switch mechanically interlocked with said first switch for selectively coupling a second terminal of a selected one of said fifth through seventh resistors to said non-inverting input of said operational amplifier.

6. The level shifting circuit of claim 4 or 5 further comprising a temperature compensating diode coupled in series with said feedback element.

7. A tuning circuit for a shortwave receiver comprising: a plurality of potentiometers having end contacts coupled across a voltage source; a first set of band selection switches having first terminals coupled to corresponding wiper contacts of said potentiometers and second terminals coupled together; a plurality of gain setting circuits, all of said gain setting circuits having input terminals coupled together and to second terminals of said band selection switches; a second set of band selection switches divided into a plurality of groups, each switch of said second set of band selection switches having a first terminal coupled to an output of a corresponding one of said gain setting circuits and all of said second set of band selection switches having second terminals coupled together; an operational amplifier having a non-inverting input coupled to said second terminals of said second set of band selection switches; a feedback element coupled between an output and an inverting input of said operational amplifier; a plurality of current sources, said current sources being equal in number to said gain setting circuits, said current sources having first terminals coupled together and to ground; and a third set of band selection switches, said third set of band selection switches being divided into groups corresponding to those of said second set of band selection switches, each group of said third set of band selection switches being coupled to a corresponding one of said current sources and all of said switches of said third set of band selection switches having second terminals coupled together and to said inverting input of said operational amplifier.

8. A level shifting circuit, consisting of an operational amplifier, a feedback element provided between an inverting input of said operational amplifier and an output thereof, a temperature compensating diode coupled in series with said feedback element; and a constant current source, an output of said constant current source being connected only to said inverting input of said operational amplifier, a signal to be level shifted being applied only to a non-inverting input of said operational amplifier.

9. A level shifting circuit, consisting of an operational amplifier, a feedback element provided between an inverting input of said operational amplifier and an output thereof, a constant current source, an output of said constant current source being connected only to said inverting input of said operational amplifier, a signal to be level shifted being applied only to a non-inverting input of said operational amplifier, and an input attenuating circuit coupled between a source of said signal to be level shifted and said non-inverting input of said operational amplifier.

* * * * *